(12) United States Patent
Abe et al.

(10) Patent No.: US 10,658,213 B2
(45) Date of Patent: May 19, 2020

(54) STORAGE FACILITY

(71) Applicant: Daifuku Co., Ltd., Osaka-shi (JP)

(72) Inventors: Takeshi Abe, Hinocho (JP); Tadahiro Yoshimoto, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 48 days.

(21) Appl. No.: 16/219,043

(22) Filed: Dec. 13, 2018

(65) Prior Publication Data

US 2019/0189486 A1 Jun. 20, 2019

(30) Foreign Application Priority Data

Dec. 20, 2017 (JP) ................................. 2017-244087

(51) Int. Cl.
*H01L 21/673* (2006.01)
*H01L 21/677* (2006.01)
*B65B 31/04* (2006.01)

(52) U.S. Cl.
CPC ........ *H01L 21/67393* (2013.01); *B65B 31/04* (2013.01); *H01L 21/67389* (2013.01); *H01L 21/67769* (2013.01)

(58) Field of Classification Search
CPC ......... H01L 21/67393; H01L 21/67389; H01L 21/67769; B65B 31/04
USPC ........................................................ 141/63
See application file for complete search history.

(56) References Cited

U.S. PATENT DOCUMENTS

| 2004/0002224 | A1* | 1/2004 | Chono ............. H01L 21/67017 438/714 |
| 2004/0045592 | A1* | 3/2004 | Yamamoto ............... B08B 3/02 134/157 |
| 2004/0069226 | A1* | 4/2004 | Yoshida ........... H01L 21/67751 118/715 |
| 2004/0110106 | A1* | 6/2004 | Mokuo ............... F27B 17/0025 432/5 |
| 2014/0003893 | A1* | 1/2014 | Takahara ................. B65G 1/06 414/273 |
| 2014/0009045 | A1* | 1/2014 | Otsuka .................... A47F 10/00 312/31 |
| 2014/0014225 | A1 | 1/2014 | Takahara et al. |
| 2015/0000759 | A1* | 1/2015 | Takahara ................ F17C 13/02 137/15.04 |

(Continued)

FOREIGN PATENT DOCUMENTS

JP 2013139319 A 7/2013

*Primary Examiner* — Timothy L Maust
*Assistant Examiner* — James R Hakomaki
(74) *Attorney, Agent, or Firm* — The Webb Law Firm

(57) ABSTRACT

A storage facility includes N accommodating sections, where N is a positive integer, M main pipes through which an inert gas flows, where M is a positive integer of 2≤M<N, M flow control devices, M branch pipe groups, and a plurality of switching valves. Each branch pipe group includes N branch pipes, and the switching valves are respectively provided on the branch pipes included in at least (M−1) of the branch pipe groups. Each flow control device is configured to control the flow rate of the inert gas flowing through the main pipe to which this flow control device is connected, based on a flow-through pipe count, which is the number of the branch pipes for which the flow of the inert gas is not blocked by the switching valve, out of the N branch pipes of the branch pipe group that corresponds to this main pipe.

6 Claims, 7 Drawing Sheets

(56) References Cited

U.S. PATENT DOCUMENTS

| | | | |
|---|---|---|---|
| 2015/0000765 A1* | 1/2015 | Otsuka | H01L 21/67389 |
| | | | 137/356 |
| 2015/0000785 A1* | 1/2015 | Shin | F17C 5/007 |
| | | | 141/4 |
| 2015/0003941 A1* | 1/2015 | Takahara | B65G 1/16 |
| | | | 414/269 |

* cited by examiner

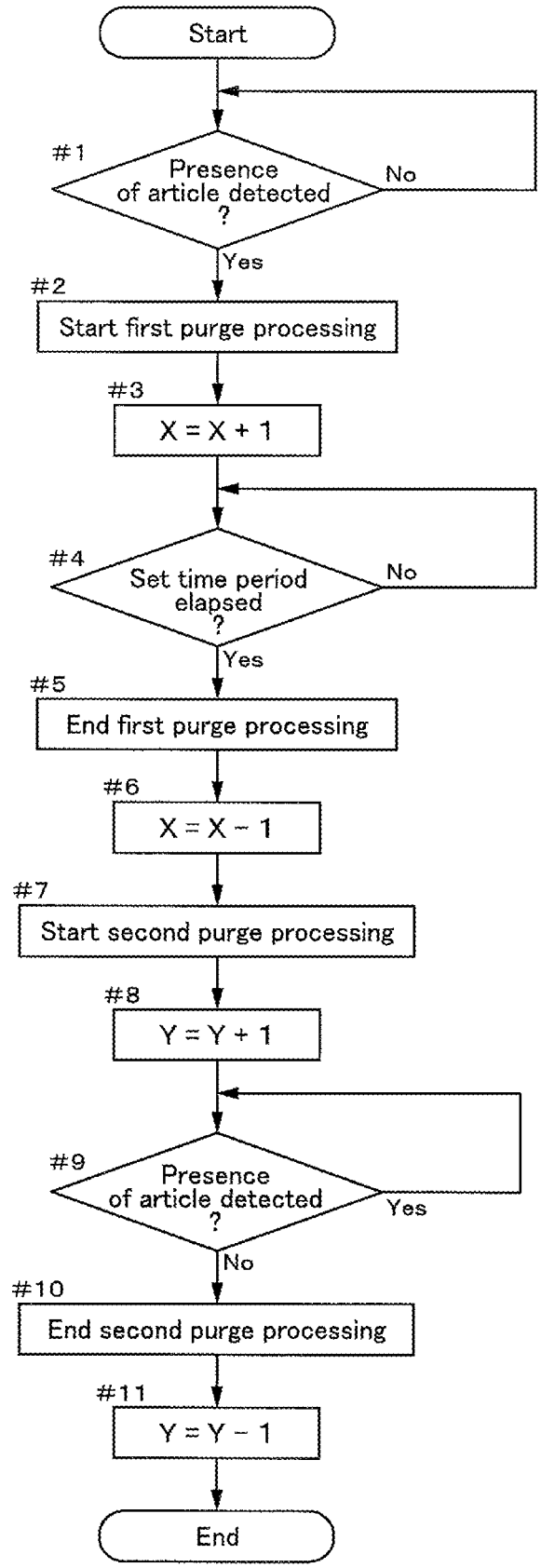

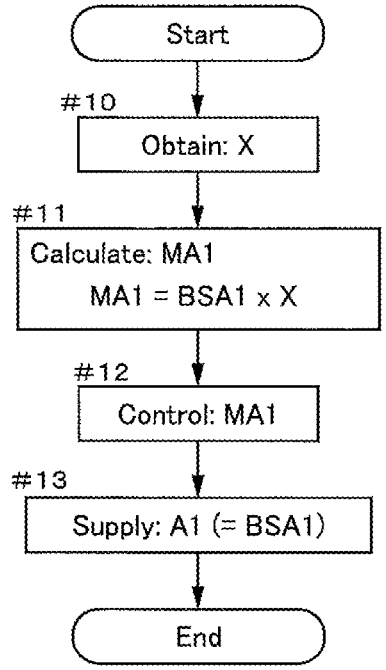
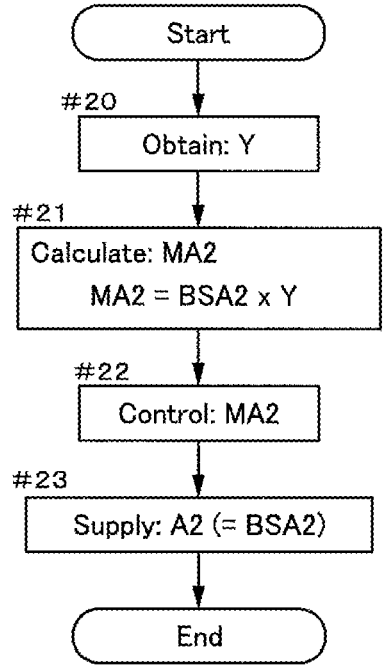

US 10,658,213 B2

STORAGE FACILITY

CROSS-REFERENCE TO RELATED APPLICATION

This application claims priority to Japanese Patent Application No. 2017-244087 filed Dec. 20, 2017, the disclosure of which is hereby incorporated in its entirety by reference.

FIELD OF THE INVENTION

The present invention relates to a storage facility that supplies an inert gas to a plurality of accommodating sections for accommodating an article.

BACKGROUND

An example of a storage facility as described above is disclosed in Patent Document 1 (JP 2013-139319A). The storage facility disclosed in Patent Document 1 is provided with a plurality of accommodating sections [10S] for accommodating a FOUP [50] serving as an article. The FOUP [50] houses therein semiconductor wafers [W]. By supplying an inert gas into the FOUPs [50] accommodated in the accommodating sections [10S], the storage facility disclosed in Patent Document 1 prevents the oxidation of the semiconductor wafers [W] and keeps the inside of the FOUPs [50] clean, thereby keeping the storage state of the semiconductor wafers [W] housed in the FOUPs [50] in a good condition.

In the storage facility of Patent Document 1, the plurality of accommodating sections [10S] each have a flow control device [40] such as a mass flow controller, and the flow rate of the inert gas that is supplied to each accommodating section [10S] is controlled appropriately by the flow control device [40].

SUMMARY OF THE INVENTION

Meanwhile, in a storage facility as described above, it is easy to appropriately control the supply of an inert gas for each accommodating section, but the same number of the flow control devices as the accommodating sections need to be provided. Accordingly, in a large storage facility with a large number of accommodating sections, the number of the flow control devices increases as well, causing a reduction in efficiency in space or an increase in cost.

In view of the above-described circumstances, there is a demand for the realization of a technique, in a storage facility, for enabling appropriate control of the supply of an inert gas to each accommodating section while reducing the number of installed flow control devices relative to that of the accommodating sections.

According to the present disclosure, a storage facility includes:

N accommodating sections each for accommodating an article, where N is a positive integer, the N accommodating sections being supplied with an inert gas;

M main pipes through which the inert gas flows, where M is a positive integer of 2≤M<N;

M flow control devices that are respectively connected to the M main pipes, and are configured to control a flow rate of the inert gas flowing through the main pipes;

M branch pipe groups respectively provided for the M main pipes; and a plurality of switching valves;

wherein each of the branch pipe groups includes N branch pipes that are branched from the main pipe and are in communication with the respective N accommodating sections, the switching valves are respectively provided on the branch pipes included in at least (M−1) of the branch pipe groups, and are configured to selectively block a flow of the inert gas through the branch pipe, and each of the flow control devices is configured to control the flow rate of the inert gas flowing through the main pipe to which this flow control device is connected, based on a flow-through pipe count, which is the number of the branch pipes for which the flow of the inert gas is not blocked by the switching valve, out of the N branch pipes of the branch pipe group that corresponds to this main pipe.

According to this configuration, each flow control device can control, based on a flow-through pipe count of the branch pipe group, the flow rate of the inert gas flowing through the main pipe to which this branch pipe group is connected, and can supply, to the main pipe, the appropriate amount of inert gas based on the state of the flow of the inert gas blocked by the switching valves. Accordingly, it is possible to supply the appropriate amount of inert gas to each of the branch pipes for which the flow of the inert gas is not blocked, that is, to each of the accommodating sections that are in communication with these branch pipes. Furthermore, it is possible to supply, using the M flow control devices, the inert gas to the N accommodating sections, where N is larger than M. Accordingly, it is possible to reduce the number of the installed flow control devices relative to that of accommodating sections.

Further features and advantages of the technique according to the present disclosure will become more apparent from the following description of exemplified and non-limiting embodiments with reference to the drawings.

BRIEF DESCRIPTION OF THE DRAWINGS

FIG. 4 is a flowchart illustrating a control procedure of the storage facility according to the first embodiment.

FIG. 5 is a flowchart illustrating a control procedure of a first flow control device.

FIG. 6 is a flowchart illustrating a control procedure of a second flow control device.

DETAILED DESCRIPTION

1. First Embodiment

Figure 1:
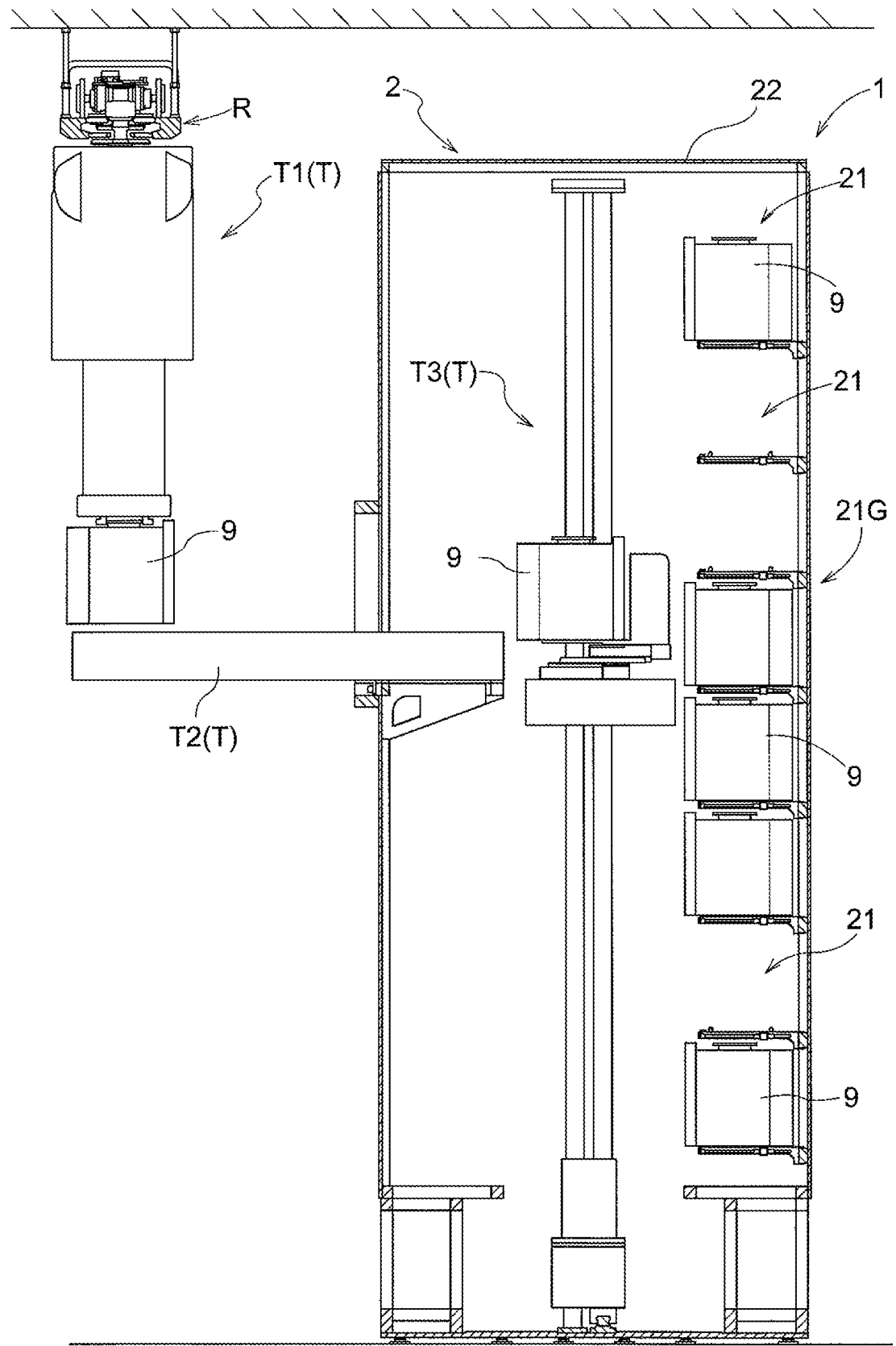
FIG. 1 is a longitudinal side view illustrating a storage facility according to a first embodiment.

A first embodiment of a storage facility will be described with reference to the drawings. As shown in FIG. 1, a storage facility 1 is provided with N accommodating sections 21 for accommodating an article 9 (where N is a positive integer). The storage facility 1 supplies an inert gas to each of the N accommodating sections 21.

According to the present embodiment, the articles 9 accommodated in the accommodating sections 21 are each a container into which an inert gas is supplied. For example, the article 9 is a front opening unified pod (FOUP) in which semiconductor wafers are housed. Note, however, that the article 9 is not limited to this, and may also be a reticle pod in which reticles are housed. In other words, the articles 9 configured by containers such as FOUPs or reticle pods are accommodated in the accommodating sections 21.

To prevent the oxidation of semiconductor wafers or reticles housed in FOUPs or reticle pods serving as the articles 9 and keep the insides of the FOUPs clean, processing for supplying an inert gas into the articles 9 is performed. Such processing is referred to as "purge processing". Purge processing can keep the environment inside the articles 9 appropriate for storage. For example, a nitrogen gas is used as an inert gas.

In the present embodiment, the flow rate of the inert gas that is supplied to each of the N accommodating sections 21 is set to a first flow rate A1 for filling up the article 9 with the inert gas, and a second flow rate A2 for continuously supplying the inert gas to the article 9 after the article 9 has been filled with the inert gas, the second flow rate A2 being lower than the first flow rate A1.

Here, the purge processing that is executed by supplying the inert gas into each article 9 at the first flow rate A1 is referred to as "first purge processing". The first purge processing is executed to quickly fill the article 9 with an inert gas by supplying the inert gas into the article 9 at a relatively high flow rate. With this processing, the inside of the article 9 is quickly brought into a desired state. Also, here, the purge processing that is executed by supplying the inert gas into the article 9 at the second flow rate A2 is referred to as "second purge processing". The second purge processing is executed, after the first purge processing, to continuously supply the inert gas into the article 9 at a flow rate that is lower than the first flow rate A1. With this processing, outside air and dust are prevented from entering the article 9. The first purge processing may also be referred to as "initial purge", and the second purge processing may also be referred to as "maintenance purge". The first flow rate A1 of the first purge processing is set to 40 [l/min] for example, and the second flow rate A2 of the second purge processing is set to 5 [l/min] for example.

In the storage facility 1, purge processing executed on the articles 9 accommodated in the accommodating sections 21 can suppress the oxygen concentration or humidity inside the articles 9 (containers) and keep out dust, thereby keeping the insides of the articles 9 clean. Accordingly, for example, semiconductor wafers, reticles, or the like that are housed in the articles 9 can be stored in a good condition.

In the present embodiment, the storage facility 1 is provided with a storage rack 2 that includes a plurality of accommodating section groups 21G each constituted by N accommodating sections 21, and a transport device T for transporting an article 9 to the storage rack 2. Note that the transport device T not only transports (loads) an article 9 to the storage rack 2 but also transports (unloads) an article 9 from the storage rack 2.

The storage rack 2 has a wall 22 that covers the plurality of accommodating section groups 21G. The plurality of accommodating sections 21 constituting the plurality of accommodating section groups 21G are lined up in a vertical direction and a left-right (horizontal) direction. An article 9 is accommodated in an accommodating section 21 in a state of being rested thereon. In the present example, one article 9 is accommodated in one accommodating section 21.

The transport device T includes a first transport device T1 that transports an article 9 from another place to an external position near the storage rack 2, a second transport device T2 that transports the article 9 from the external position near the storage rack 2 to the inside of the storage rack 2, and a third transport device T3 that transports the article 9 to an accommodating section 21 within the storage rack 2. Note that the first transport device T1, the second transport device T2, and the third transport device T3 also perform transport in the reverse direction.

The first transport device T1 is configured as, for example, an overhead transport vehicle that travels along a rail R provided on the ceiling while holding an article 9. Furthermore, the first transport device T1 has an elevating mechanism and is configured to be able to rise and lower the article 9. In other words, the first transport device T1 transports an article 9 from another place to an external position near the storage rack 2, and gives this article 9 to the second transport device T2, which is arranged below the first transport device T1. The first transport device T1 also receives an article 9 from the second transport device T2, and transports this article 9 from an external position near the storage rack 2 to another place.

The second transport device T2 is configured as, for example, a conveyor for transporting an article 9 while supporting the bottom thereof. A belt conveyor, a roller conveyor, a chain conveyor, or the like may be used as the second transport device T2. The second transport device T2 is provided spanning between the outside of the storage rack 2 and the inside of the storage rack 2. Also, the second transport device T2 receives, in an external region of the storage rack 2, an article 9 from the first transport device T1 and transports this article 9 to an internal region of the storage rack 2, and gives, in the internal region, this article 9 to the third transport device T3. The second transport device T2 also receives, in an internal region of the storage rack 2, an article 9 from the third transport device T3, transports this article 9 to an external region of the storage rack 2, and gives it to the first transport device T1.

The third transport device T3 is arranged inside the storage rack 2, and is configured as, for example, a stacker crane that has an elevating mechanism of rising and lowering in the up and down directions, and a travelling mechanism of travelling in the horizontal direction. The third transport device T3 moves in the vertical direction and the horizontal direction while holding an article 9, and transports the article 9 to one of the plurality of accommodating sections 21 lined up in the vertical direction and the horizontal direction. The third transport device T3 receives, in an internal region of the storage rack 2, an article 9 from the second transport device T2, and transports this article 9 to an accommodating section 21. Furthermore, the third transport device T3 transports the article 9 accommodated in an accommodating section 21, and gives, in an internal region of the storage rack 2, this article 9 to the second transport device T2.

Figure 2:
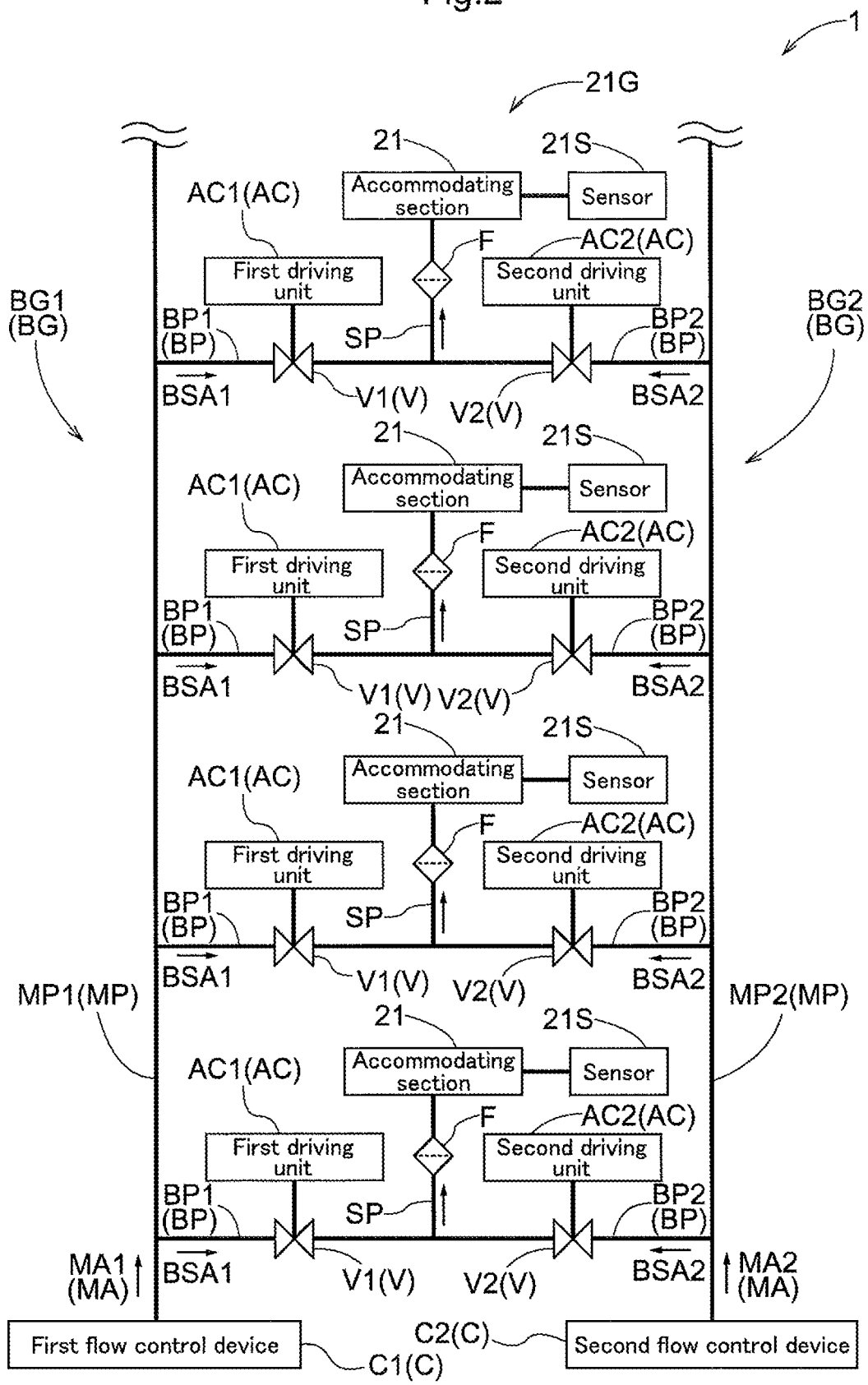
FIG. 2 is a diagram schematically illustrating the storage facility according to the first embodiment.

The following will describe a configuration for supplying an inert gas to the accommodating sections 21. FIG. 2 is a diagram schematically illustrating a configuration of the storage facility 1 for supplying an inert gas to the N accommodating sections 21. In the following, a description will be given based on a single accommodating section group 21G that includes N accommodating sections 21. More specifically, the number of the constituent components that will be described below is based on a single accommodating section group 21G that includes N accommodating sections 21.

As shown in FIG. 2, the storage facility 1 is provided with M main pipes MP through which an inert gas flows (where M is a positive integer of 2−M<N). The present embodiment will describe an example in which "M" is "2", that is, an example in which two (M) main pipes MP are provided for N accommodating sections 21. Furthermore, the relationship between "M" and "N", which is the number of the accommodating sections 21 constituting an accommodating section group 21G for example, is given as "M<N". Since "M" is "2" in the present example as described above, "N" is a "positive integer that is larger than 2". Accordingly, in the present embodiment, a single accommodating section group 21G includes at least three accommodating sections 21. Note that, in the present example, one of the two main pipes MP is defined as "first main pipe MP1" and the other one is defined as "second main pipe MP2".

As shown in FIG. 2, the storage facility 1 is provided with two (M) branch pipe groups BG that respectively correspond to the two (M) main pipes MP. In the present example, the branch pipe group BG that corresponds to the first main pipe MP1 is referred to as "first branch pipe group BG1", and the branch pipe group BG that corresponds to the second main pipe MP2 is referred to as "second branch pipe group BG2".

Each of the two (M) branch pipe groups BG includes N branch pipes BP that are branched from the main pipe MP and are in communication with the respective N accommodating sections 21. In the present example, the first branch pipe group BG1 includes N first branch pipes BP1 that are branched from the first main pipe MP1. Also, the second branch pipe group BG2 includes N second branch pipes BP2 that are branched from the second main pipe MP2. The number of the first branch pipes BP1 branched from the first main pipe MP1 and the number of the second branch pipes BP2 branched from the second main pipe MP2 are equal to each other.

In the present embodiment, two (M) branch pipes BP that are in communication with one of the N accommodating sections 21 are joined together and connected to a single supply pipe SP, and are in communication with this accommodating section 21 via the supply pipe SP. In the present example, a first branch pipe BP1 and a second branch pipe BP2 that are in communication with the same accommodating section 21 are joined together and connected to a single supply pipe SP. N supply pipes SP are provided in conformity to the N accommodating sections 21 and the N branch pipes BP.

In the shown example, a filter F for removing impurities from inert gas is provided on the upstream side of each accommodating section 21 with respect to a direction in which an inert gas flows. Accordingly, it is possible to supply the inert gas from which impurities were removed to the accommodating section 21. In the present embodiment, a filter F is provided on each supply pipe SP, and is configured to remove impurities from the inert gas flowing through the supply pipe SP. Accordingly, it is possible to reduce the number of the filters F compared to a case where a filter is provided on each branch pipe BP, while preventing particles generated by a switching valve V or the like from reaching the accommodating section 21.

As shown in FIG. 2, the storage facility 1 is provided with two (M) flow control devices C that are respectively connected to the two (M) main pipes MP and control the flow rate of the inert gas flowing through the main pipes MP. In other words, the storage facility 1 is provided with smaller number of flow control devices C than the number of the accommodating sections 21, and in the present embodiment, two flow control devices C are provided for at least three accommodating sections 21. In the shown example, the two (M) flow control devices C include a first flow control device C1 and a second flow control device C2. The first flow control device C1 is connected to the first main pipe MP1, and the second flow control device C2 is connected to the second main pipe MP2.

The flow control devices C are each configured to control the flow rate of the inert gas and supply the inert gas to the corresponding main pipe MP (target main pipe) at a set flow rate. The flow control devices C are configured as mass flow controllers, for example. Note, however, that the present invention is not limited thereto, and other types of flow control devices C, such as devices that control the volumetric flow rate, may also be used as long as they can control the flow rate of an inert gas and supply the inert gas.

As shown in FIG. 2, the storage facility 1 is provided with a plurality of switching valves V. The switching valves V are respectively provided on N branch pipes BP included in at least (M−1) of the branch pipe groups BG, and are configured to selectively block a flow of the inert gas through the branch pipe BP. In the present embodiment, the switching valves V are provided on all of the branch pipes BP included in two (M) branch pipe groups BG. In the present example, the switching valves V provided on the first branch pipes BP1 are referred to as "first switching valves V1". Furthermore, the switching valves V provided on the second branch pipes BP2 are referred to as "second switching valves V2".

Each switching valve V is configured to be able to be open and closed, and allows, in the open state, the inert gas to flow through the corresponding branch pipe BP, and blocks, in the closed state, the flow of the inert gas through this branch pipe BP. In the present embodiment, the switching valve V is driven by a driving unit AC, and is configured to be open and closed. In the present example, a first switching valve V1 is driven by a first driving unit AC1, and a second switching valve V2 is driven by a second driving unit AC2.

Each driving unit AC employs, for example, a solenoid, and drives the corresponding switching valve V so that it is open or closed based on the electric current flow state. In this case, a configuration is also possible in which the driving unit AC and the switching valve V are integrated into a solenoid valve.

In the storage facility 1 having the above-described configuration, an inert gas is supplied to the main pipes MP at a flow rate adjusted by the flow control devices C. Also, when the switching valve V provided on a branch pipe BP is open, the inert gas flows into this branch pipe BP from the main pipe MP. Then, the inert gas flows through the supply pipe SP, and is supplied to the accommodating section 21 with its impurities removed by the filter F.

Each flow control device C controls the flow rate of the inert gas flowing through the main pipe MP to which this flow control device C is connected (hereinafter, referred to as "main pipe flow rate MA"), based on a flow-through pipe count that is the number of the branch pipes BP for which the flow of the inert gas is not blocked by the switching valve V out of the N branch pipes BP of the branch pipe group BG that corresponds to this main pipe MP. In the present example, the first flow control device C1 controls the flow rate of the inert gas flowing through the first main pipe MP1 (hereinafter, referred to as "first main pipe flow rate MA1"), based on a flow-through pipe count that is the number of the first branch pipes BP1 for which the flow of the inert gas is not blocked by the first switching valve V1. Also, the second flow control device C2 controls the flow rate of the inert gas flowing through the second main pipe MP2 (hereinafter, referred to as "second main pipe flow rate MA2"), based on a flow-through pipe count that is the number of the second branch pipes BP2 for which the flow of the inert gas is not blocked by the second switching valve V2.

In the present embodiment, each flow control device C performs control such that the flow rate of the inert gas flowing through a target main pipe, that is, the main pipe MP to which this flow control device C is connected (main pipe flow rate MA), is equal to the flow rate obtained by multiplying a standard flow rate BSA, which is preset for every branch pipe BP branched from the target main pipe, by the flow-through pipe count of the branch pipe group BG that corresponds to the target main pipe. Here, the standard flow rate BSA preset for every first branch pipe BP1 branched from the first main pipe MP1 to which the first flow control device C1 is connected is referred to as "first standard flow rate BSA1", and the standard flow rate BSA preset for every second branch pipe BP2 branched from the second main pipe MP2 to which the second flow control device C2 is connected is referred to as "second standard flow rate BSA2".

Also, the first flow control device C1 supplies an inert gas to the first main pipe MP1 at the first main pipe flow rate MA1, which is calculated based on the first standard flow rate BSA1. Also, the second flow control device C2 supplies an inert gas to the second main pipe MP2 at the second main pipe flow rate MA2, which is calculated based on the second standard flow rate BSA2.

In the present embodiment, the first standard flow rate BSA1 and the second standard flow rate BSA2 are set to different values. Here, the first standard flow rate BSA1 corresponds to the above-described first flow rate A1, and the second standard flow rate BSA2 corresponds to the above-described second flow rate A2. In other words, the first standard flow rate BSA1 is set to the first flow rate A1 of the inert gas that is supplied to the articles 9 in the first purge processing. Also, the second standard flow rate BSA2 is set to the second flow rate A2 (A2<A1) of the inert gas that is supplied to the articles 9 in the second purge processing.

For example, focusing on one accommodating section 21, a case will be considered in which purge processing is executed on the article 9 accommodated in this accommodating section 21. In this case, in the first purge processing, the second driving unit AC2 closes the second switching valve V2 so that the flow of the inert gas through the second branch pipe BP2 is blocked, and the first driving unit AC1 opens the first switching valve V1 so that the inert gas is caused to flow through the first branch pipe BP1 at the first standard flow rate BSA1. Accordingly, the inert gas passes, at the first standard flow rate BSA1 (=first flow rate A1), through the supply pipe SP and the filter F provided thereon and is supplied to the accommodating section 21.

Then, after completion of the first purge processing, the second purge processing is performed on the article 9 accommodated in this accommodating section 21. In this case, in the second purge processing, the first driving unit AC1 closes the first switching valve V1 so that the flow of the inert gas through the first branch pipe BP1 is blocked, and the second driving unit AC2 opens the second switching valve V2 so that the inert gas is caused to flow through the second branch pipe BP2 at the second standard flow rate BSA2. Accordingly, the inert gas passes, at the second standard flow rate BSA2 (=second flow rate A2), through the supply pipe SP and the filter F provided thereon and is supplied to the accommodating section 21.

In this way, the first purge processing and the second purge processing are executed on one accommodating section 21. Here, as described above, each flow control device C supplies an inert gas to the corresponding main pipe MP at the flow rate based on the flow-through pipe count of the branch pipe group BG, or more specifically, the flow rate obtained by multiplying the standard flow rate BSA by the flow-through pipe count. Accordingly, the storage facility 1 can supply an inert gas to each of the same number of accommodating sections 21 as the flow-through pipe count, at flow rates that are close to the standard flow rates respectively set for the first purge processing and the second purge processing.

Figure 3:
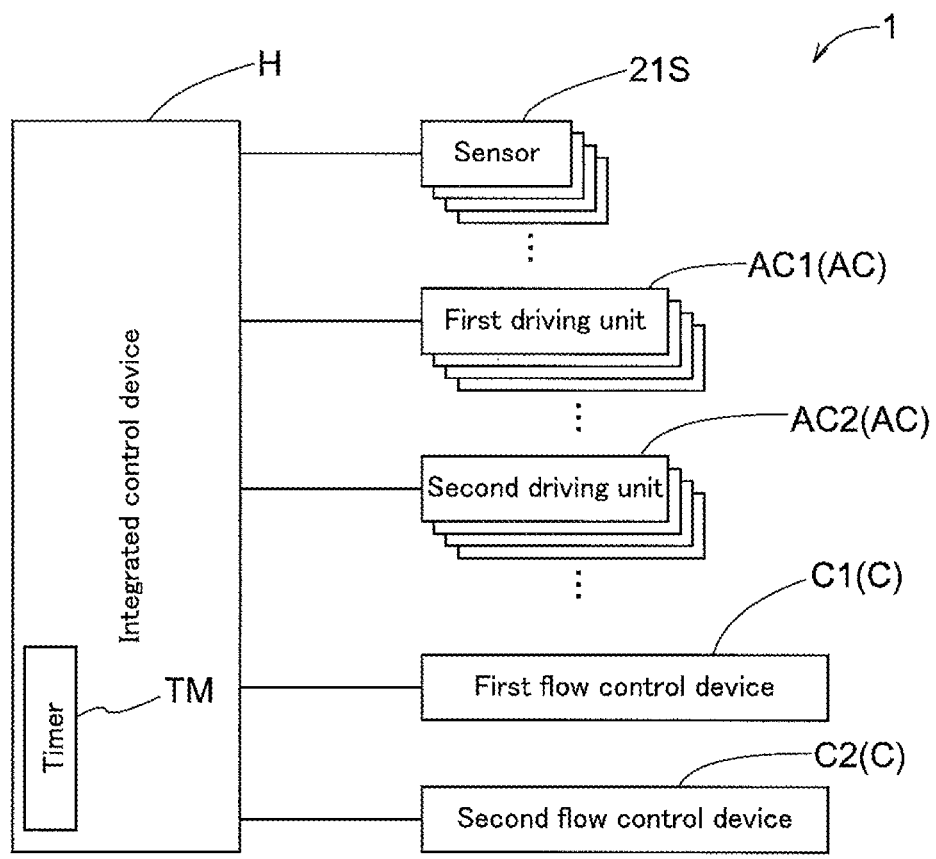
FIG. 3 is a control block diagram of the storage facility according to the first embodiment.

The following will describe a configuration of control of the storage facility 1. FIG. 3 is a block diagram illustrating a configuration of control of the storage facility 1.

As shown in FIG. 3, the storage facility 1 is provided with an integrated control device H for performing control of the entire facility. The integrated control device H is provided with, for example, a processor such as a microcomputer, a peripheral circuit such as a memory, and the like. As a result of cooperation of these pieces of hardware and programs executed on the processor such as a computer, the functions of the integrated control device H are realized.

The integrated control device H is configured to be able to receive signals from sensors 21S (see also FIG. 2) provided for the accommodating sections 21. Here, each sensor 21S is configured to detect an article 9 that is accommodated in the corresponding accommodating section 21. In other words, the sensor 21S detects whether or not an article is present in the accommodating section 21. The sensor 21S may be, for example, an optical sensor for detecting whether or not an article is present based on a shadow created by an article 9, or a contact type sensor for detecting whether or not an article is present based on contact from, or pressure of, an article 9. Another well-known detection means may also be used as the sensor 21S.

The integrated control device H is configured to be able to transmit and receive signals between the plurality of first driving units AC1 and the plurality of second driving units AC2. The integrated control device H controls each of the plurality of first switching valves V1 and the plurality of second switching valves V2 (see also FIG. 2) to be in the open or closed state, by giving an instruction to each of the plurality of first driving units AC1 and the plurality of second driving units AC2. Furthermore, based on the control states of, and control instructions given to, the plurality of first switching valves V1 and the plurality of second switching valves V2 by the integrated control device H, the integrated control device H can recognize the number of the first switching valves V1 that are open, the number of the first switching valves V1 that are closed, the number of the second switching valves V2 that are open, and the number of the second switching valves V2 that are closed.

Then, based on the number of the first switching valves V1 that are open, the integrated control device H obtains a first flow-through pipe count, which is the number of the first branch pipes BP1 for which the flow of the inert gas is not blocked. Here, the number of the first switching valves V1 that are open is equal to the first flow-through pipe count. Also, based on the number of the second switching valves V2 that are open, the integrated control device H obtains a second flow-through pipe count, which is the number of the second branch pipes BP2 for which the flow of the inert gas is not blocked. Here, the number of the second switching valves V2 that are open is equal to the second flow-through pipe count. Then, the integrated control device H calculates the first main pipe flow rate MA1 by multiplying the first standard flow rate BSA1 by the first flow-through pipe count. Also, the integrated control device H calculates the second main pipe flow rate MA2 by multiplying the second standard flow rate BSA2 by the second flow-through pipe count.

Furthermore, the integrated control device H is configured to be able to transmit and receive signals between the first flow control device C1 and the second flow control device C2. When executing the first purge processing, the integrated control device H closes all of the second switching valves V2 and opens the required number of first switching valves V1. Then, the integrated control device H transmits, to the first flow control device C1, an instruction relating to the first main pipe flow rate MA1 calculated based on the number of the first switching valves V1 that are open. In response to this instruction, the first flow control device C1 performs control such that the flow rate of the inert gas to be supplied to the first main pipe MP1 is equal to the first main pipe flow rate MA1. In this way, the first purge processing is executed on the accommodating sections 21. Also, when executing the second purge processing after the first purge processing, the integrated control device H closes all of the first switching valves V1, and opens the required number of second switching valves V2. Then, the integrated control device H transmits, to the second flow control device C2, an instruction relating to the second main pipe flow rate MA2 calculated based on the number of the second switching valves V2 that are open. In response to this instruction, the second flow control device C2 performs control such that the flow rate of the inert gas to be supplied to the second main pipe MP2 is equal to the second main pipe flow rate MA2. In this way, the second purge processing is executed in the accommodating sections 21.

Here, as described above, after the article 9 has been filled with the inert gas through the first purge processing, the integrated control device H ends the first purge processing and starts the second purge processing at an appropriate time. Accordingly, in the present embodiment, the integrated control device H includes a timer TM. The integrated control device H measures, using the timer TM, the time elapsed from the start of the first purge processing. In the present example, the integrated control device H ends the first purge processing running on the accommodating sections 21 when a set time period has elapsed from the start of the first purge processing, and executes the second purge processing. More specifically, if an article 9 is accommodated in an empty accommodating section 21, the integrated control device H will first instruct, in order to start the first purge processing, the corresponding first driving unit AC1 to open the first switching valve V1 connected to this accommodating section 21. Then, the integrated control device H continues the first purge processing until the set time period elapses. When the set time period has elapsed, the integrated control device H instructs, in order to end the first purge processing and start the second purge processing, the first driving unit AC1 to close the first switching valve V1 connected to this accommodating section 21, and the corresponding second driving unit AC2 to open the second switching valve V2. In each of the first purge processing and the second purge processing, the integrated control device H gives an instruction relating to the flow rate, as described above, to the first flow control device C1 and the second flow control device C2. Accordingly, the first purge processing and the second purge processing are sequentially executed. Note that such control performed by the integrated control device H is executed on each of the plurality of accommodating sections 21.

The following will describe a control procedure executed in the storage facility 1. FIG. 4 is a flowchart illustrating a control procedure executed in the entire storage facility 1.

As shown in FIG. 4, first, the integrated control device H acquires information relating to the detection of the presence of an article via the sensor 21S provided in an accommodating section 21 (#1). If an article 9 is accommodated in the accommodating section 21, the sensor 21S will detect the presence of the article. If the presence of an article has been detected (Yes in #1), the integrated control device H starts the first purge processing (#2). At the start of first purge processing performed on one accommodating section 21, the integrated control device H adds "1" to a first purge processing count X, which is the sum total of the number of times first purge processing is being performed in an accommodating section group 21G (#3). For example, if, in a state in which the first purge processing count X is "2", an article 9 is accommodated in another empty accommodating section 21 and new first purge processing is started on the other accommodating section 21, "1" will be added to the first purge processing count X, and the resultant X will be "3".

Then, the integrated control device H determines whether or not the set time period has elapsed from the start of the first purge processing (#4). If it is determined that the set time period has elapsed (Yes in #4), the integrated control device H ends the first purge processing (#5), and subtracts "1" from the first purge processing count X before the end of the first purge processing (#6). Then, the integrated control device H starts the second purge processing (#7). At the start of the second purge processing performed on one accommodating section 21, the integrated control device H adds "1" to a second purge processing count Y, which is the sum total of the number of times second purge processing is being performed in an accommodating section group 21G (#8). For example, if, in a state in which the second purge processing count Y is "4", the first purge processing running continuously on another accommodating section 21 is ended and new second purge processing is started thereon, "1" will be added to the second purge processing count Y, and the resultant Y will be "5".

Then, the integrated control device H continuously acquires information relating to the detection of the presence of an article performed by the sensor 21S provided in the accommodating section 21 on which the second purge processing is being executed (#9). Then, if an article is no longer detected (NO in #9), the integrated control device H ends the second purge processing (#10), and subtracts "1" from the second purge processing count Y before the end of the second purge processing (#11).

The following will describe a control procedure that is performed on the first flow control device C1 by the integrated control device H with reference to FIG. 5. The integrated control device H obtains the first purge processing count X of the first branch pipe group BG1 (#10). Here, the first purge processing is executed by opening the first switching valve V1 provided on the first branch pipe BP1 that is in communication with the target accommodating section 21. Accordingly, the first purge processing count X of the first branch pipe group BG1 is equal to the first flow-through pipe count. After having obtained the first purge processing count X (the first flow-through pipe count), the integrated control device H calculates the first main pipe flow rate MA1 by multiplying the first standard flow rate BSA1 by the first purge processing count X (#11). Then, the integrated control device H outputs an instruction relating to the calculated first main pipe flow rate MA1 to the first flow control device C1, and controls the first flow control device C1 to set the flow rate of the inert gas flowing through the first main pipe MP1 to the first main pipe flow rate MA1 (#12). Accordingly, the inert gas is caused to flow, at the first standard flow rate BSA1, through each of the same number of first branch pipes BP1 as the first purge processing count X, and is supplied to the target accommodating section 21 at the first flow rate A1 (=first standard flow rate BSA1) (#13).

The following will describe a control procedure that is performed on the second flow control device C2 by the integrated control device H with reference to FIG. 6. The integrated control device H obtains the second purge processing count Y of the second branch pipe group BG2 (#20). Here, the second purge processing is executed by opening the second switching valve V2 provided on the second branch pipe BP2 that is in communication with the target accommodating section 21. Accordingly, the second purge processing count Y of the second branch pipe group BG2 is equal to the second flow-through pipe count. After having obtained the second purge processing count Y (the second flow-through pipe count), the integrated control device H calculates the second main pipe flow rate MA2 by multiplying the second standard flow rate BSA2 by the second purge processing count Y (#21). Then, the integrated control device H outputs an instruction relating to the calculated second main pipe flow rate MA2 to the second flow control device C2, and controls the second flow control device C2 to set the flow rate of the inert gas flowing through the second main pipe MP2 to the second main pipe flow rate MA2 (#22). Accordingly, the inert gas is caused to flow, at the second standard flow rate BSA2, through each of the same number of second branch pipes BP2 as the second purge processing count Y, and is supplied to the target accommodating section 21 at the second flow rate A2 (=second standard flow rate BSA2) (#23).

In the above-described configuration, the first flow rate A1 and the second flow rate A2 are controlled by using the first flow control device C1 and the second flow control device C2, as well as opening only either the first switching valve V1 and the second switching valve V2. Note, however, that the present invention is not limited to this configuration, and a configuration is also possible in which, for example, by opening both the first switching valve V1 and the second switching valve V2, the inert gas is supplied to the accommodating section 21 at the flow rate that corresponds to the sum of the first standard flow rate BSA1 and the second standard flow rate BSA2 (for example, a third flow rate A3: BSA1+BSA2). In this case, it is preferable to appropriately use the first flow rate A1, the second flow rate A2, and the third flow rate A3, depending on the usage.

2. Second Embodiment

Hereinafter, a second embodiment of the storage facility 1 will be described. The following description will be given mainly focusing on differences from the first embodiment. The features specifically not explained are the same as those of the first embodiment.

Figure 7:
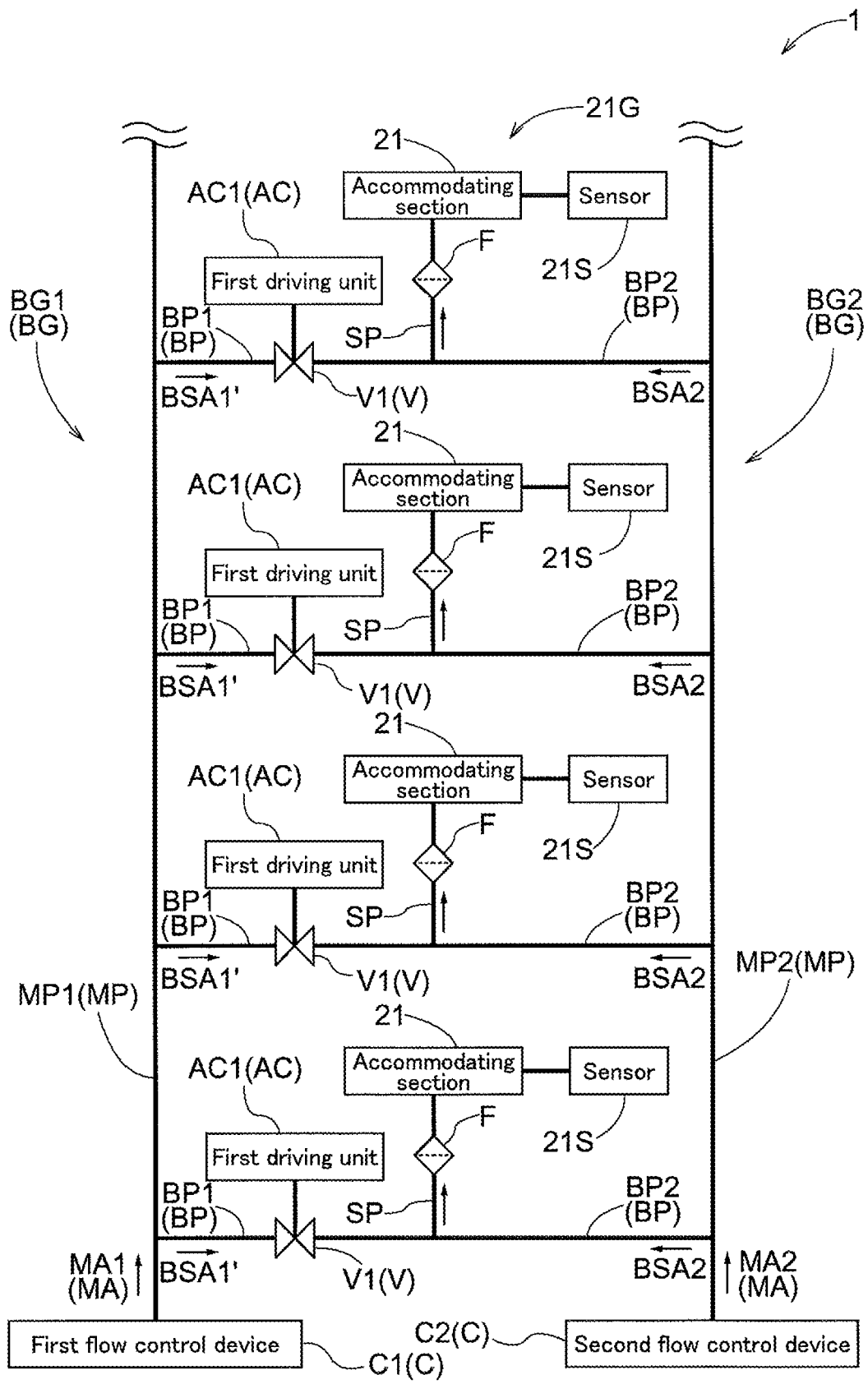
FIG. 7 is a diagram schematically illustrating a storage facility according to a second embodiment.

As shown in FIG. 7, in the present embodiment, switching valves V are respectively provided on N branch pipes BP included in (M−1) branch pipe group BG, namely, one branch pipe group BG. In the shown example, the first switching valves V1 (switching valves V) are respectively provided on N first branch pipes BP1 included in the first branch pipe group BG1, and no switching valve V is provided on N second branch pipes BP2 included in the second branch pipe group BG2. Accordingly, the present embodiment has a configuration in which inert gas flowing through each of the N first branch pipes BP1 can be blocked selectively, but inert gas always flows through each of the N second branch pipes BP2.

In the present embodiment, a first standard flow rate BSA1', which is a standard flow rate BSA for every first branch pipe BP1, and a second standard flow rate BSA2, which is a standard flow rate BSA for every second branch pipe BP2, are set such that the sum thereof is equal to the first flow rate A1 (for example, 40 [l/min]), which is the flow rate for filling up the article 9 with the inert gas. Also, the second standard flow rate BSA2 is set to be the second flow rate A2 (for example, 5 [l/min]), which is the flow rate for continuously supplying the inert gas to the article 9 after it has been filled with the inert gas. In the present embodiment, first purge processing for supplying the inert gas to an accommodating section 21 at the first flow rate A1 (first standard flow rate BSA1'+second standard flow rate BSA2) is executed by supplying, to the accommodating section 21, a mixture of the inert gas from the first branch pipe BP1 and the inert gas from the second branch pipe BP2. Furthermore, second purge processing for supplying an inert gas to the accommodating section 21 at the second flow rate A2 (second standard flow rate BSA2) is executed by supplying, to the accommodating section 21, an inert gas from the second branch pipe BP2.

For example, focusing on one accommodating section 21, a case will be considered in which purge processing is executed on the article 9 accommodated in the accommodating section 21. In this case, in the first purge processing, the first driving unit AC1 opens the first switching valve V1 so that the inert gas is caused to flow through the first branch pipe BP1 at the first standard flow rate BSA1'. At this time, the inert gas always flows through the second branch pipe BP2 at the second standard flow rate BSA2. Accordingly, the inert gas flows through the supply pipe SP at the flow rate (first flow rate A1) that corresponds to the sum of the first standard flow rate BSA1' and the second standard flow rate BSA2. Accordingly, the inert gas passes, at the first flow rate A1, through the supply pipe SP and the filter F provided thereon, and is supplied to the accommodating section 21.

Then, after completion of the first purge processing, the second purge processing is executed on the article 9 accommodated in this accommodating section 21. In this case, in the second purge processing, the first driving unit AC1 closes the first switching valve V1 so that the flow of the inert gas through the first branch pipe BP1 is blocked. At this time, the inert gas always flows through the second branch pipe BP2 at the second standard flow rate BSA2. Accordingly, the inert gas flows through the supply pipe SP at the flow rate (second flow rate A2) that corresponds to the second standard flow rate BSA2. Accordingly, the inert gas passes, at the second flow rate A2, through the supply pipe SP and the filter F provided thereon, and is supplied to the accommodating section 21.

Figure 8:
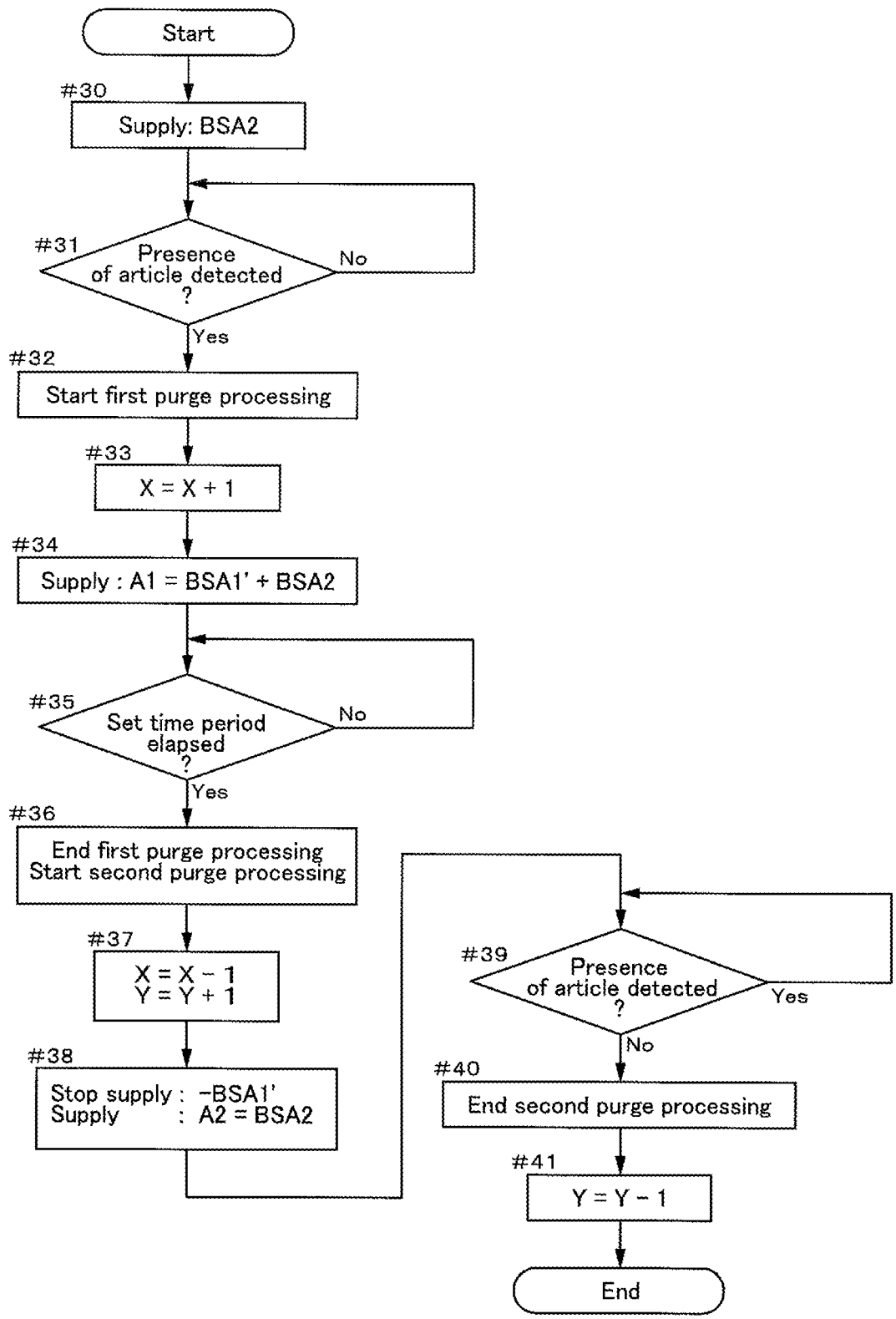
FIG. 8 is a flowchart illustrating a control procedure of the storage facility according to the second embodiment.

The following will describe a control procedure that is performed on the storage facility 1 according to the second embodiment. FIG. 8 is a flowchart showing a control procedure that is performed on the entire storage facility 1.

In the present embodiment, no switching valve V is provided on the second branch pipes BP2, and thus the inert gas is always supplied, at the second standard flow rate BSA2, to the second branch pipes BP2 and the accommodating sections 21 that are in communication with them (#30). The integrated control device H acquires information relating to the detection of the presence of an article performed by the sensor 21S provided in an accommodating section 21 (#31). If the presence of an article has been detected (Yes in #31), the integrated control device H starts the first purge processing (#32). At the start of the first purge processing performed on one accommodating section 21, the integrated control device H adds "1" to the first purge processing count X (#33). Then, the first switching valve V1 provided on the first branch pipe BP1 is driven into the open state, and the inert gas is supplied to the first branch pipe BP1 at the first standard flow rate BSA1'. Accordingly, the inert gas is supplied to the accommodating section 21, at the first flow rate A1 that corresponds to the sum of the first standard flow rate BSA1' and the second standard flow rate BSA2 (#34).

Then, the integrated control device H determines whether or not a set time period has elapsed from the start of the first purge processing (#35). If it is determined that the set time period has elapsed (Yes in #35), the integrated control device H ends the first purge processing and starts the second purge processing (#36). Then, the integrated control device H subtracts "1" from the first purge processing count X before the end of the first purge processing, and adds "1" to the second purge processing count Y before the start of the second purge processing (#37). Accordingly, the first switching valve V1 provided on the first branch pipe BP1 is driven into the closed state, and supply of inert gas at the flow rate that corresponds to the first standard flow rate BSA1' is stopped, and the inert gas is supplied to the accommodating section 21 at the second flow rate A2 that corresponds to the second standard flow rate BSA2 (#38).

Then, the integrated control device H continuously acquires information relating to the detection of the presence of an article performed by the sensor 21S provided in the accommodating section 21 on which the second purge processing is being executed (#39). If an article is no longer detected (No in #39), the integrated control device H ends the second purge processing (#40), and subtracts "1" from the second purge processing count Y before the end of the second purge processing (#41).

3. Other Embodiments

Hereinafter, other embodiments of the storage facility will be described.

(1) In the above-described embodiments, an example has been described in which two (M) main pipes MP are provided and two (M) flow control devices C are provided. However, the present invention is not limited to this example, and a configuration is also possible in which at least three main pipes MP are provided, and the same number of flow control devices C as the main pipes MP, and the same number of branch pipe groups BG as the main pipes MP are provided. For example, if first to third main pipes MP1 to MP3 are provided, and first to third flow control devices C1 to C3 and first to third branch pipes BP1 to BP3 that correspond to these main pipes MP are provided, the flow rate of the inert gas flowing through the third branch pipe BP3 is set to a third standard flow rate BSA3, which is equal to the first standard flow rate BSA1 or the second standard flow rate BSA2, or is different from them. In this case, it is possible to supply the inert gas to an accommodating section 21 at a plurality of flow rates that can be realized by the first standard flow rate BSA1, the second standard flow rate BSA2, and the third standard flow rate BSA3, and a combination thereof. Accordingly, such a configuration is advantageous if it is desirable to provide a large number of stages in supply flow rates of the inert gas.

(2) In the above-described embodiments, an example has been described in which two (M) branch pipes BP that are in communication with the same accommodating section 21 are joined together and connected to a single supply pipe SP, and are in communication with the accommodating section 21 via the supply pipe SP. However, the present invention is not limited to this example, and a configuration is also possible in which M branch pipes BP that are in communication with the same accommodating section 21 are directly connected to the accommodating section 21 without the supply pipe SP interposed therebetween. Also, in the above-described embodiments, an example has been described in which a filter F is provided on the supply pipe SP, but a configuration is also possible in which the filter F is provided on each of M branch pipes BP, regardless of whether or not there is a supply pipe SP. Although the filter F is preferably arranged on the downstream side of a switching valve V, a case where the filter F is provided on the upstream side of a switching valve V is also not excluded.

(3) In the above-described embodiments, an example has been described in which the first standard flow rate BSA1 and the second standard flow rate BSA2 are set to different values. However, the present invention is not limited to this example, and the first standard flow rate BSA1 and the second standard flow rate BSA2 may also be set to be equal to each other. In such a case, for example, the first standard flow rate BSA1 and the second standard flow rate BSA2 may also be set such that the sum thereof is equal to the flow rate that corresponds to the first flow rate A1 used when first purge processing is performed (BSA1+BSA2=A1). Also, the first standard flow rate BSA1 and the second standard flow rate BSA2 may be set such that the sum thereof is equal to the flow rate that corresponds to the second flow rate A2 used when the second purge processing is performed (A2=BSA1 or BSA2). In this way, even if the first standard flow rate BSA1 and the second standard flow rate BSA2 are equal to each other, it is possible to set the first flow rate A1 and the second flow rate A2 to different values.

(4) Note that the configurations disclosed in the foregoing embodiments can also be combined with a configuration disclosed in the other embodiments unless they contradict each other. With respect to other configurations, the embodiments disclosed in the present description are merely examples in all respects. Therefore, a variety of modifications are possible as appropriate within the scope without departing from the spirit of the present disclosure.

4. Overview of the Foregoing Embodiments

Hereinafter, overview of the above-described storage facility will be described.

A storage facility comprising:

N accommodating sections each for accommodating an article, where N is a positive integer, the N accommodating sections being supplied with an inert gas;

M main pipes through which the inert gas flows, where M is a positive integer of 2≤M<N;

M flow control devices that are respectively connected to the M main pipes, and are configured to control a flow rate of the inert gas flowing through the main pipes;

M branch pipe groups respectively provided for the M main pipes; and a plurality of switching valves;

wherein each of the branch pipe groups includes N branch pipes that are branched from the main pipe and are in communication with the respective N accommodating sections, the switching valves are respectively provided on the branch pipes included in at least (M−1) of the branch pipe groups, and are configured to selectively block a flow of the inert gas through the branch pipe, and each of the flow control devices is configured to control the flow rate of the inert gas flowing through the main pipe to which this flow control device is connected, based on a flow-through pipe count, which is the number of the branch pipes for which the flow of the inert gas is not blocked by the switching valve, out of the N branch pipes of the branch pipe group that corresponds to this main pipe.

According to this configuration, each flow control device can control, based on a flow-through pipe count of the branch pipe group, the flow rate of the inert gas flowing through the main pipe to which this branch pipe group is connected, and can supply, to the main pipe, the appropriate amount of inert gas based on the state of the flow of the inert gas blocked by the switching valves. Accordingly, it is possible to supply the appropriate amount of inert gas to each of the branch pipes for which the flow of the inert gas is not blocked, that is, to each of the accommodating sections that are in communication with these branch pipes. Furthermore, it is possible to supply, using the M flow control devices, the inert gas to the N accommodating sections, where N is larger than M. Accordingly, it is possible to reduce the number of installed flow control devices relative to that of accommodating sections.

Here, preferably, the switching valves are respectively provided on all of the branch pipes included in the M branch pipe groups.

According to this configuration, all of the branch pipes included in the M branch pipe groups can be switched between a state in which the flow of the inert gas is blocked, and a state in which the flow of the inert gas is not blocked. Accordingly, it is possible to suppress unnecessary inert gas flow, thus making it possible to efficiently use the inert gas.

Here, preferably, each of the flow control devices is configured to perform control such that the flow rate of the inert gas flowing through a target main pipe, which is the main pipe to which this flow control device is connected, is equal to a flow rate obtained by multiplying a standard flow rate that is preset for every branch pipe branched from the target main pipe by the flow-through pipe count of the branch pipe group that corresponds to the target main pipe.

According to this configuration, the flow control device connected to a target main pipe can cause the inert gas to flow, at a flow rate close to the standard flow rate, through the branch pipes for which the flow of the inert gas is not blocked, out of N branch pipes branched from this target main pipe.

Here, preferably, the M flow control devices include a first flow control device and a second flow control device, the standard flow rate preset for every branch pipe branched from the main pipe to which the first flow control device is connected is a first standard flow rate, the standard flow rate preset for every branch pipe branched from the main pipe to which the second flow control device is connected is a second standard flow rate, and the first standard flow rate and the second standard flow rate are set to different values.

According to this configuration, it is easy to supply an inert gas to an accommodating section at a plurality of different flow rates. Accordingly, the flow rate of the inert gas to be supplied to the accommodating section can be switched according to the usage.

Here, preferably, the articles that are accommodated in the accommodating sections are each a container into which the inert gas is supplied, the flow rate of the inert gas that is supplied to each of the N accommodating sections is set to a first flow rate for filling up the container with the inert gas, and a second flow rate for continuously supplying the inert gas to the container after the container has been filled with the inert gas, the second flow rate being lower than the first flow rate, and the first standard flow rate corresponds to the first flow rate, and the second standard flow rate corresponds to the second flow rate.

According to this configuration, the first flow control device can supply the inert gas to the accommodating sections at the first flow rate, and the second flow control device can supply the inert gas to the accommodating sections at the second flow rate. According to this configuration, thus, it is possible to supply the inert gas to the accommodating sections at flow rates that are appropriate when filling up the container with the inert gas, and when continuously supplying the inert gas to the container after it has been filled with the inert gas.

Here, preferably, M branch pipes that are in communication with one accommodating section are joined together and connected to a single supply pipe, and are in communication with the accommodating section via the supply pipe, and the supply pipe is provided with a filter for removing impurities from the inert gas flowing through the supply pipe.

According to this configuration, the inert gas from which impurities were removed by the filter can be supplied to the accommodating section. Also, as a result of such a filter being provided on each supply pipe to which M branch pipes are joined together and connected, it is possible to reduce the number of the filters that are installed in the facility.

INDUSTRIAL APPLICABILITY

The technique according to the present disclosure is applicable to a storage facility that supplies an inert gas to a plurality of accommodating sections for accommodating an article.

What is claimed is:

1. A storage facility comprising:
N accommodating sections each for accommodating an article, where N is a positive integer, the N accommodating sections being supplied with an inert gas;
M main pipes through which the inert gas flows, where M is a positive integer of $2 \leq M < N$;
M flow control devices that are respectively connected to the M main pipes, and are configured to control a flow rate of the inert gas flowing through the main pipes;
M branch pipe groups respectively provided for the M main pipes; and
a plurality of switching valves;
wherein each of the branch pipe groups includes N branch pipes that are branched from the main pipe and are in communication with the respective N accommodating sections,
wherein the switching valves are respectively provided on the branch pipes included in at least (M−1) of the branch pipe groups, and are configured to selectively block a flow of the inert gas through the branch pipe, and
wherein each of the flow control devices is configured to control the flow rate of the inert gas flowing through the main pipe to which this flow control device is connected, based on a flow-through pipe count, which is the number of the branch pipes for which the flow of the inert gas is not blocked by the switching valve, out of the N branch pipes of the branch pipe group that corresponds to this main pipe.

2. The storage facility according to claim 1, wherein the switching valves are respectively provided on all of the branch pipes included in the M branch pipe groups.

3. The storage facility according to claim 1, wherein each of the flow control devices is configured to perform control such that the flow rate of the inert gas flowing through a target main pipe, which is the main pipe to which this flow control device is connected, is equal to a flow rate obtained by multiplying a standard flow rate that is preset for every branch pipe branched from the target main pipe by the flow-through pipe count of the branch pipe group that corresponds to the target main pipe.

4. The storage facility according to claim 3, wherein:
the M flow control devices include a first flow control device and a second flow control device,
the standard flow rate preset for every branch pipe branched from the main pipe to which the first flow control device is connected is a first standard flow rate,
the standard flow rate preset for every branch pipe branched from the main pipe to which the second flow control device is connected is a second standard flow rate, and
the first standard flow rate and the second standard flow rate are set to different values.

5. The storage facility according to claim 4,
wherein the articles that are accommodated in the accommodating sections are each a container into which the inert gas is supplied,
wherein the flow rate of the inert gas that is supplied to each of the N accommodating sections is set to a first flow rate for filling up the container with the inert gas, and a second flow rate for continuously supplying the inert gas to the container after the container has been filled with the inert gas, the second flow rate being lower than the first flow rate, and
wherein the first standard flow rate corresponds to the first flow rate, and the second standard flow rate corresponds to the second flow rate.

6. The storage facility according to claim 1, wherein M branch pipes that are in communication with the same accommodating section are joined together and connected to a single supply pipe, and are in communication with the accommodating section via the supply pipe, and
wherein the supply pipe is provided with a filter for removing impurities from the inert gas flowing through the supply pipe.

* * * * *